(12) United States Patent
Kordic et al.

(10) Patent No.: US 6,528,419 B1
(45) Date of Patent: Mar. 4, 2003

(54) PROCESS OF FABRICATING AN INTEGRATED CIRCUIT

(75) Inventors: Srdjan Kordic, Bernin (FR); Joaquin Torres, St. Martin Le Vinoux (FR); Pascale Motte, La Tour du Pin (FR); Brigitte Descouts, Meylan (FR)

(73) Assignees: STMicroelectronics S.A., Montrouge (FR); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/790,259

(22) Filed: Feb. 21, 2001

(30) Foreign Application Priority Data

Feb. 14, 2000 (FR) .......................................... 00 011801

(51) Int. Cl.$^7$ ............................................... H01L 21/44
(52) U.S. Cl. ....................... 438/675; 438/633; 438/687; 438/618
(58) Field of Search ................................ 438/687, 675, 438/653, 683, 685

(56) References Cited

U.S. PATENT DOCUMENTS

| | | | |
|---|---|---|---|
| 5,595,937 A | | 1/1997 | Mikagi |
| 5,821,168 A | | 10/1998 | Jain |
| 6,093,632 A | * | 7/2000 | Lin .............................. 438/618 |
| 6,100,181 A | * | 8/2000 | You et al. .................... 438/633 |
| 6,197,681 B1 | * | 3/2001 | Liu et al. ..................... 438/637 |
| 6,218,302 B1 | * | 4/2001 | Braeckelmann et al. .... 438/687 |
| 6,225,210 B1 | * | 5/2001 | Ngo et al. ................... 438/624 |
| 6,258,707 B1 | * | 7/2001 | Uzoh .......................... 438/618 |

FOREIGN PATENT DOCUMENTS

EP   0 552 968 A2   7/1993

OTHER PUBLICATIONS

French Preliminary Search Report dated Jul. 17, 2000 for French Patent Application No. 0001801.

* cited by examiner

*Primary Examiner*—David Nelms
*Assistant Examiner*—Theo Le
(74) *Attorney, Agent, or Firm*—Lisa K. Jorgenson; Stephen Bongini; Fleit, Kain, Gibbons, Gutman & Bongini P.L.

(57) ABSTRACT

A process produces at a predetermined metallization level at least one metal track (7) within an intertrack dielectric material (1). The process includes the steps of etching the intertrack dielectric material (1) so as to form a cavity (4) at the position of the track, depositing a conducting barrier layer (5) in the cavity (4), filling the cavity (4) with copper, and depositing a silicon nitride layer (8) on the predetermined metallization level. Between the barrier layer deposition step and the copper filling step, titanium is deposited on at least part of the barrier layer. This titanium will be transformed into TiSi$_2$ (60) during the diffusion of the silicon from the silicon nitride layer (8).

13 Claims, 3 Drawing Sheets

Metallization n

Metallization n

PROCESS OF FABRICATING AN INTEGRATED CIRCUIT

CROSS-REFERENCE TO RELATED APPLICATION

This application is based upon and claims priority from prior French Patent Application No. 0001801, filed on Feb. 14, 2000, the entire disclosure of which is herein incorporated by reference.

BACKGROUND TO THE INVENTION

1. Field of the Invention

The invention relates to the fabrication of integrated circuits and more particularly to the production of metal tracks using a process of the "damascene" type, this being a name well known to those skilled in the art.

2. Description of the Prior Art

A damascene process may be carried out according to several methods of implementation. In the method of implementation called "single damascene", a track is produced by making a cavity in the intertrack dielectric lying at the metallization level in question and then, after having deposited a conducting barrier layer, for example made of tantalum nitride, on the bottom and on the sidewalls of the cavity, by filling the cavity with a filling metal.

The fabrication of the integrated circuit also includes the deposition of an encapsulation layer, typically made of silicon nitride, on the metallization level. This deposition is conventionally carried out at high temperature, typically at 400° C. Moreover, apart from this heat treatment, the fabrication of an integrated circuit requires other heat treatments, for example after each oxide deposition. Now, during these heat treatments, and especially when depositing the silicon nitride at 400° C., small quantities of silicon can diffuse into the copper tracks from the silicon nitride encapsulation layer. This then results in a significant increase in the resistivity of the metal tracks.

At the present time, this undesirable effect on the resistance of the tracks can be avoided by exposing the metallization level to an ammonia plasma before the silicon nitride encapsulation layer is deposited. This makes it possible to prevent a subsequent silicon diffusion. However, such a plasma-based treatment may damage the transistors of the integrated circuit.

Accordingly, there exists a need for overcoming the disadvantages of the prior art as discussed above. The invention particularly aims to provide a solution to this problem discussed immediately above and proposes a radically different solution for avoiding the increase in the resistance of the metal tracks due to silicon diffusion into the copper.

SUMMARY OF THE INVENTION

A preferred embodiment of the present invention provides a process for fabricating an integrated circuit, comprising a step of producing, at a predetermined metallization level, at least one metal track within an intertrack dielectric material. This production step comprises the steps of etching the intertrack dielectric material so as to form a cavity at the position of the track, depositing a conducting barrier layer, for example made of tantalum nitride, in the cavity, filling the cavity with copper, and depositing a silicon nitride layer on the predetermined metallization level.

According to a general characteristic of the invention, the step of producing the metal track furthermore includes, between the barrier-layer deposition step and the copper-filling step, the deposition of titanium on at least part of the barrier layer.

Thus, when the silicon of the silicon nitride layer diffuses into the copper tracks, under high thermal budgets, for example greater than or equal to 400° C., it forms a titanium silicide $TiSi_2$ with titanium. The silicon which diffuses into the copper is thus trapped by the titanium, thereby allowing the low resistivity of the copper to be preserved.

In general, it is not necessary for the titanium layer to perfectly match the walls of the cavity nor for it to be perfectly continuous, since its sole purpose is to extract the silicon that has diffused into the copper therefrom (by transformation into titanium silicide). Thus, it is possible for this titanium deposition to be carried out by a simple sputtering operation, for example using an argon plasma which strikes a titanium target.

Moreover, the titanium sputtering deposition proves to be sufficient for depositing titanium particles on the upper part of the cavity, this having the advantage of being as close as possible to the silicon nitride layer.

According to one alternative preferred way of implementing the invention, prior to filling with copper, the titanium deposited in the cavity undergoes nonreactive ion etching with a plasma flux perpendicular to the bottom of the cavity. This allows the titanium in the bottom of the cavity to be removed and thus avoids the risk of increasing the resistance of the line (track). Furthermore, this non-reactive ion etching with a plasma flux perpendicular to the bottom of the cavity makes it possible to leave the plasma particles on the vertical sidewalls of the cavity, and in particular those close to the upper edge of the cavity.

BRIEF DESCRIPTION OF THE DRAWINGS

Further advantages and characteristics of the invention will become apparent on examining the detailed description of one entirely non-limiting method of implementation, and the appended drawings in which.

DESCRIPTION OF THE PREFERRED EMBODIMENTS

Figure 1A:
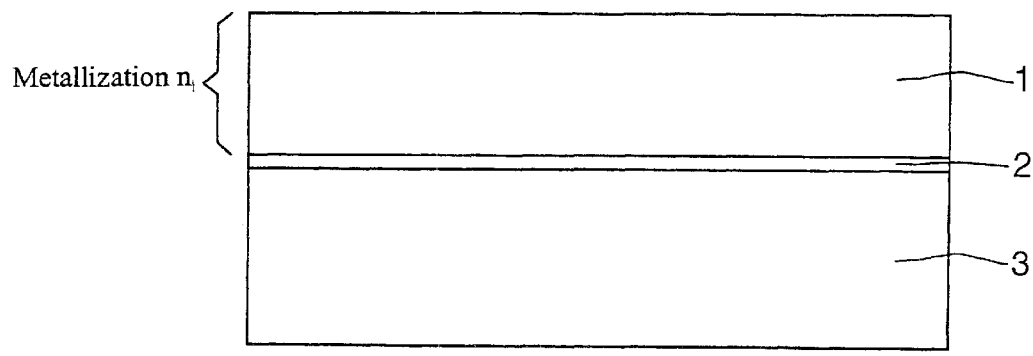
FIGS. 1a to 1h schematically illustrate one method of implementing the process according to a preferred embodiment of the present invention, and more particularly within the context of a single-damascene process.

In FIG. 1a, the reference 1 denotes a layer of an intertrack dielectric material, for example $SiO_2$ formed from tetraethoxysilane ($Si(OC_2H_5)_4$ or TEOS). It is within this layer 1 that the metal tracks of the metallization level n will be produced.

This dielectric layer 1 rests on an encapsulation layer 2, having a thickness of about 120 nm, and typically made of silicon nitride $Si_3N_4$ or more generally made of $Si_xN_y$. This encapsulation layer 2 is deposited on a layer of an interlevel dielectric material which is, for example, also of $SiO_2$ formed from tetraethoxysilane and which separates the metallization level n from the lower metallization level n-1. This interlevel dielectric layer typically has a thickness of 800 nm.

Figure 1B:
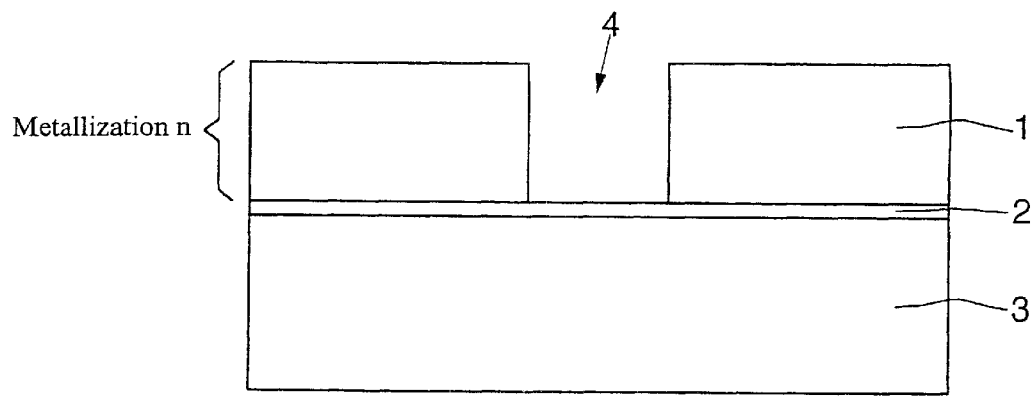

The next step (FIG. 1b) consists, using conventional photolithography methods, in etching the intertrack dielectric material 1, stopping on the encapsulation layer 2, so as to make cavities 4 (only one of these cavities is shown in FIG. 1b) at the position of the future metal tracks.

It should be noted here that the encapsulation layer 2 acts, on the one hand, as a way of preventing the interlevel dielectric from being contaminated by copper from the track of level n and, on the other hand, as a stop layer when etching the cavity.

Figure 1C:
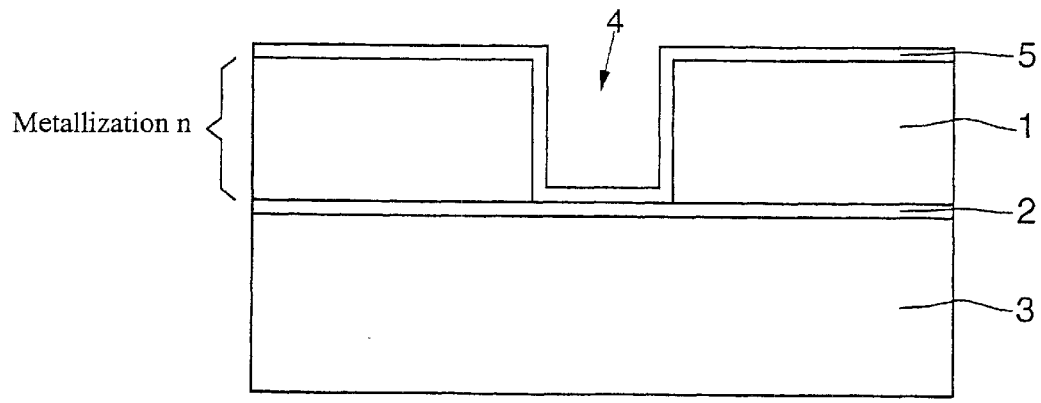

Next (FIG. 1c), the conducting barrier layer 5, typically made of tantalum nitride or titanium nitride, is conventionally deposited. This layer, with a thickness of a few tens of nanometers, for example 25 nm, serves as a barrier to the diffusion of copper particles into the intertrack dielectric.

Figure 1D:
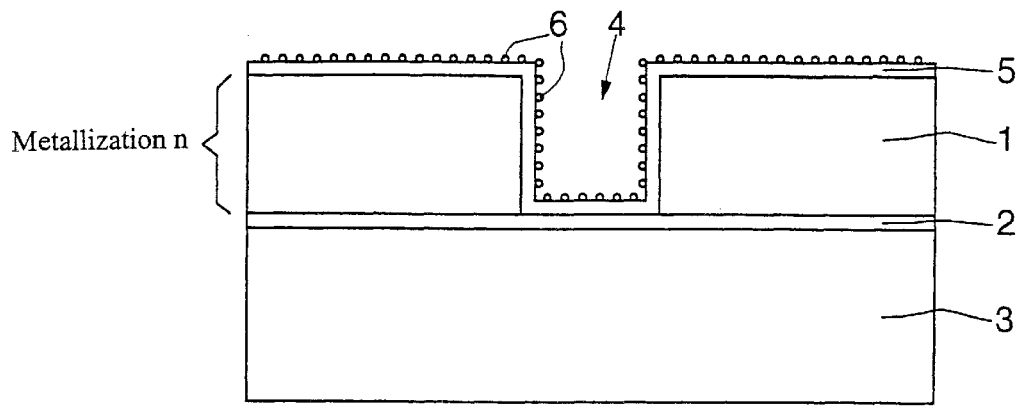

Next (FIG. 1d), titanium is deposited by sputtering, for example by using an argon-based plasma which strikes a titanium target at room temperature and at a pressure of 1 torr. The titanium particles 6 are then sputtered on the sidewalls and the bottom of the cavity 4, and on the surface of the barrier layer 5.

Figure 1E:
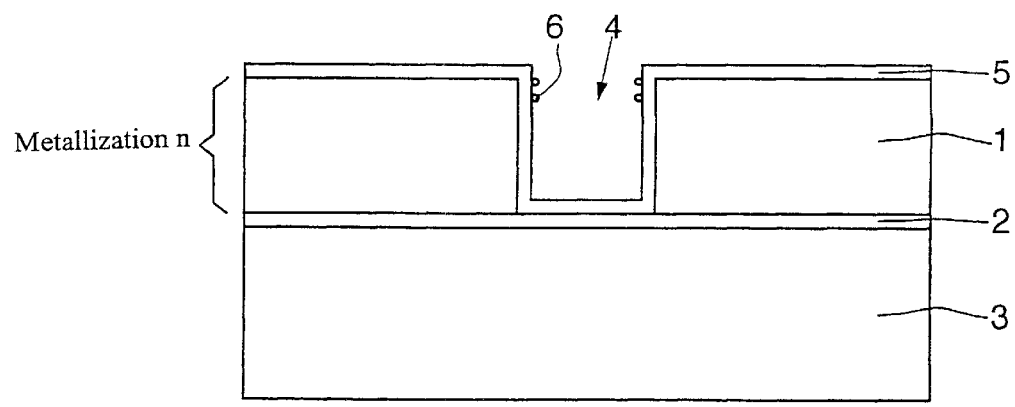

Although not absolutely essential, the next step (FIG. 1e) advantageously consists in the titanium 6 sputtered in the previous step undergoing non-reactive ion etching so as to remove the titanium particles especially from the bottom of the cavity. This non-reactive ion etching also has the consequence of removing the titanium from the upper surface of the barrier layer 5. Such non-reactive ion etching is a conventional operation for a person skilled in the art. Thus, it is typically carried out with an ion flux directed at right angles to the bottom of the cavity 4.

This cleaning step makes it possible to remove the titanium from the bottom of the cavity, thereby avoiding the risk of increasing the resistance of the subsequent metal track.

Figure 1F:
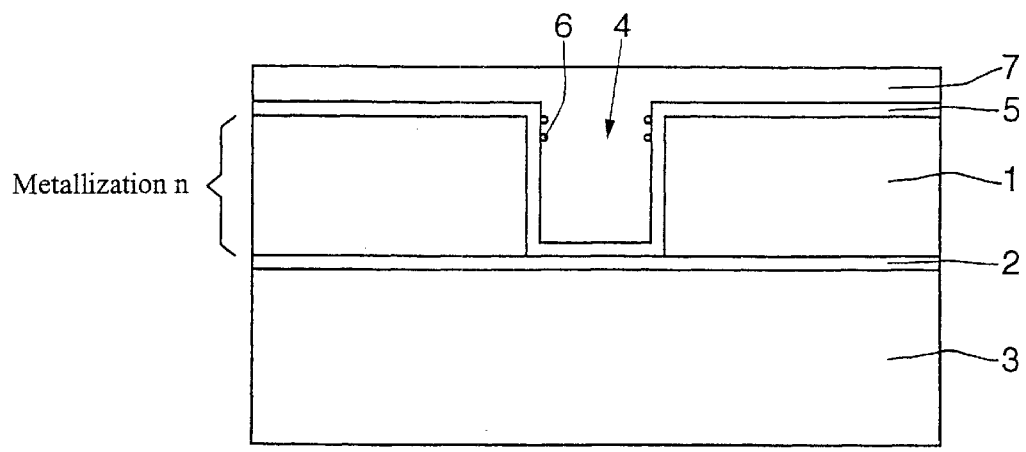
Figure 1G:
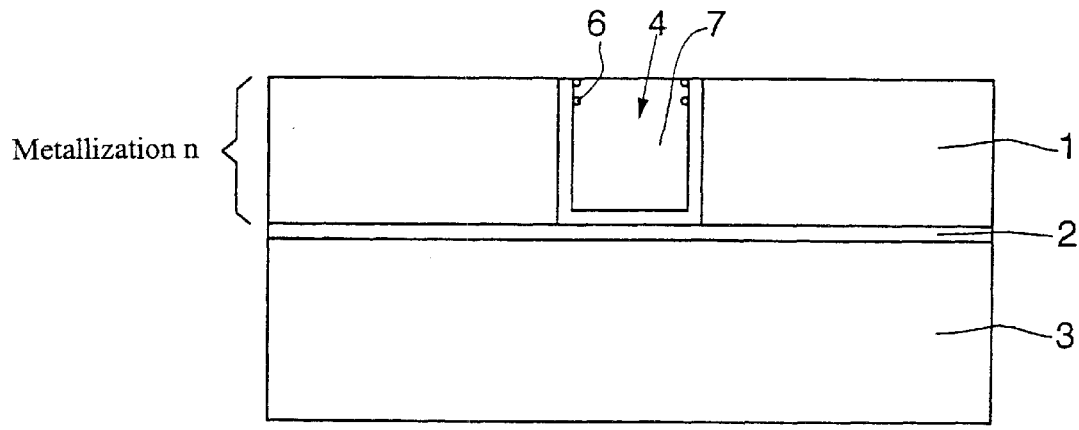

Next (FIG. 1f), a copper layer 7 is conventionally deposited, and this is followed by conventional chemical mechanical polishing so as to obtain the configuration illustrated in FIG. 1g. This polishing also makes it possible, advantageously, to remove possible titanium residues that might have remained after the non-reactive ion etching of the titanium.

Figure 1H:
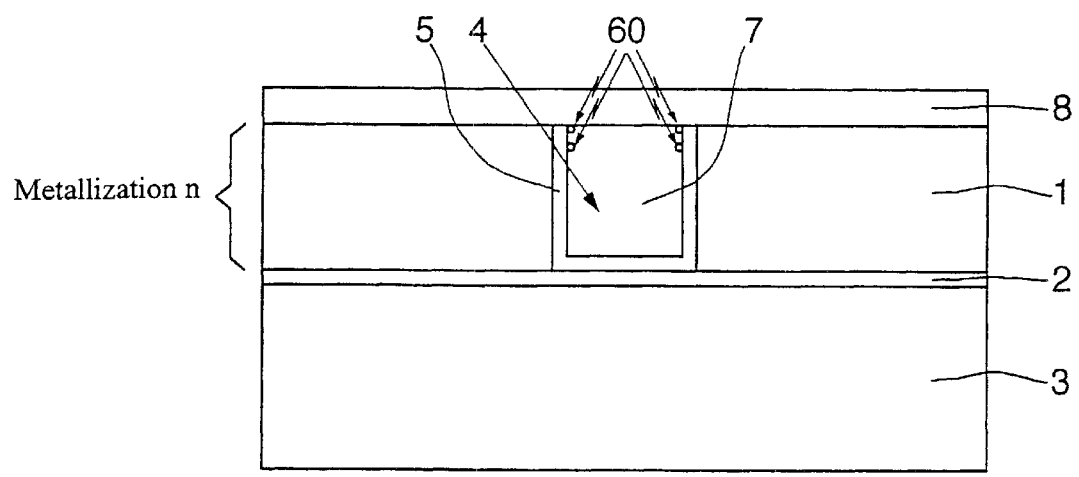

Next (FIG. 1h), another silicon nitride encapsulation layer 8 is deposited. This deposition is conventionally carried out under a thermal budget of about 400° C., thereby causing silicon to diffuse into the copper of the cavity 4. However, the silicon that has thus diffused is trapped by the titanium particles and is transformed into a titanium silicide ($TiSi_2$) 60, thereby allowing the low resistivity of the copper to be preserved.

The invention therefore has the advantage of not affecting the low resistivity of the copper of the metal tracks, while at the same time preventing any damage to the transistors of the integrated circuit.

Of course, the invention is not limited to the so called "single damascene" method of implementation that has just been described. In particular, it also applies to the method of implementation called "self-aligned double damascene" in which the cavities of the vertical metal connections (commonly called "vias" by those skilled in the art) and the cavities of the future tracks of the upper metallization level are etched simultaneously.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating an integrated circuit, comprising a step of:
   producing, at a predetermined metallization level, at least one metal track within an intertrack dielectric material, comprising the steps of:
      etching the intertrack dielectric material so as to form a cavity at the position of the track;
      depositing a conducting barrier layer in the cavity;
      filling the cavity with copper;
      depositing a silicon nitride layer on the predetermined metallization level; and
      depositing, between the barrier layer deposition step and the copper filling step, titanium on at least part of the barrier layer, the titanium being deposited so as to form a discontinuous titanium layer that does not completely cover the barrier layer.

2. The process according to claim 1, wherein, prior to the filling with copper, the titanium deposited undergoes non-reactive ion etching with a plasma flux perpendicular to the bottom of the cavity.

3. The process according to claim 1, wherein the titanium is deposited by sputtering.

4. The process according to claim 3, wherein, prior to the filling with copper, the titanium deposited undergoes non-reactive ion etching with a plasma flux perpendicular to the bottom of the cavity.

5. A method of avoiding an increase in the resistance of copper tracks of an integrated circuit due to silicon diffusion into the copper, said method comprising a step of:
   producing, at a predetermined metallization level, at least one copper track within an intertrack dielectric material, the producing step comprising the steps of:
      etching the intertrack dielectric material so as to form a cavity at the position of the at least one copper track;
      depositing a conducting barrier layer in the cavity;
      filling the cavity with copper to form the copper track;
      depositing, after the conducting barrier layer depositing step and prior to the copper filling step, titanium on at least part of the barrier layer; and
      depositing a silicon nitride layer on the predetermined metallization level, the deposited titanium extracting from the copper silicon that diffuses from the silicon nitride layer.

6. The method of claim 5, wherein titanium depositing step comprises the step of depositing titanium on at least part of the barrier layer by sputtering.

7. The method of claim 5, further comprising the step of, prior to the step of filling the cavity with copper, removing titanium from the bottom of the cavity.

8. The method of claim 7, wherein the step of removing titanium comprises the step of removing titanium by non-reactive ion etching with a plasma flux perpendicular to the bottom of the cavity.

9. The method of claim 5, wherein, prior to the step of filling with copper, the titanium deposited undergoes non-reactive ion etching with a plasma flux perpendicular to the bottom of the cavity.

10. A method of making an integrated circuit, comprising a step of:
    producing, at a predetermined metallization level, at least one metal track within an intertrack dielectric material, the producing step comprising the steps of:

etching the intertrack dielectric material so as to form a cavity at the position of the at least one metal track;

depositing a conducting barrier layer in the cavity;

filling the cavity with copper;

sputtering, after the conducting barrier layer depositing step and prior to the copper filling step, titanium on at least part of the barrier layer in the cavity;

prior to the step of filling the cavity with copper, removing titanium from at least the bottom of the cavity; and depositing a silicon nitride layer on the predetermined metallization level.

11. The method of claim 10, wherein the step of removing titanium comprises the step of removing titanium by non-reactive ion etching with a plasma flux perpendicular to the bottom of the cavity.

12. The process according to claim 1, wherein the producing step further comprises the step of removing, prior to the step of filling the cavity with copper, titanium from at least the bottom of the cavity.

13. A method of making an integrated circuit, comprising a step of:

producing, at a predetermined metallization level, at least one metal track within an intertrack dielectric material, the producing step comprising the steps of:

etching the intertrack dielectric material so as to form a cavity at the position of the at least one metal track;

depositing a conducting barrier layer in the cavity;

filling the cavity with copper;

depositing, after the conducting barrier layer depositing step and prior to the copper filling step, titanium on at least part of the barrier layer in the cavity;

prior to the step of filling the cavity with copper, removing titanium from at least the bottom of the cavity; and depositing a silicon nitride layer on the predetermined metallization level.

* * * * *